United States Patent [19]
Banno

[11] Patent Number: 4,839,651
[45] Date of Patent: Jun. 13, 1989

[54] APPARATUS FOR MEASURING THE DYNAMIC CHARACTERISTICS OF AN ANALOG-DIGITAL CONVERTER

[75] Inventor: Takuo Banno, Hachiojishi, Japan
[73] Assignee: Hewlett-Packard Company, Palo Alto, Calif.
[21] Appl. No.: 77,156
[22] Filed: Jul. 24, 1987
[51] Int. Cl.$^4$ ............................................. H03K 13/02
[52] U.S. Cl. ................................................... 341/120
[58] Field of Search ................................. 340/347 CC
[56] References Cited

U.S. PATENT DOCUMENTS

| | | | |
|---|---|---|---|
| 3,154,738 | 10/1964 | Greene | 340/347 CC |
| 3,816,813 | 6/1974 | Jehu | 340/347 CC X |
| 4,335,373 | 6/1982 | Sloane | 340/347 CC |
| 4,419,656 | 12/1982 | Sloane | 340/347 CC |

OTHER PUBLICATIONS

Sellier "IBM Technical Disclosure Bulletin" vol. 22, No. 3 Aug. 1979 pp. 1039–1040.
Sheingold "Analog–Digital Conversion Notes" ©1977 1980 p. 215.

Primary Examiner—Bernard Roskoski
Attorney, Agent, or Firm—Donald N. Timbie

[57] ABSTRACT

Apparatus for measuring the dynamic characteristics of an ADC in which the clock for a generator of digitized words representing a plurality of cycles of an analog wave to be derived from them by a DAC and applied to the ADC being measured is derived from the same source as the clock for the ADC. The ratio between the frequency of the plurality of cycles and the frequency of the clock is irreducible.

4 Claims, 2 Drawing Sheets

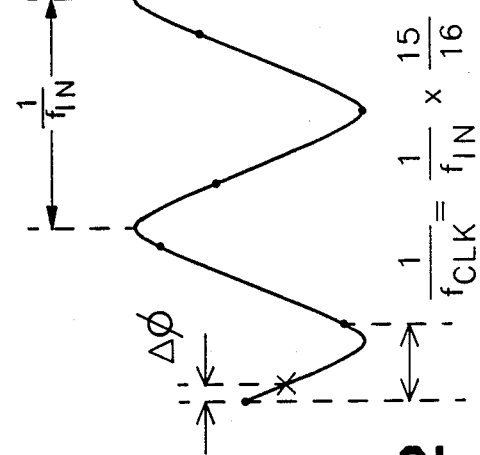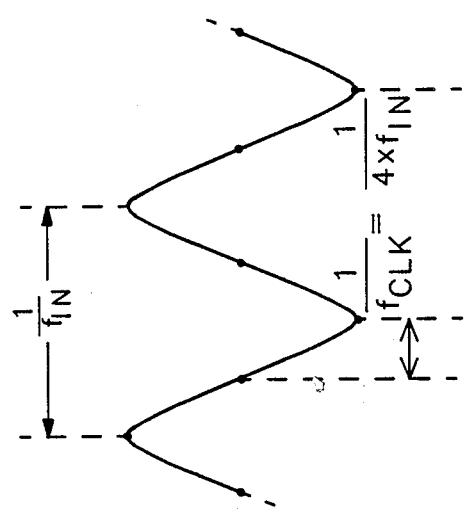
FIG 1
FIG 2

APPARATUS FOR MEASURING THE DYNAMIC CHARACTERISTICS OF AN ANALOG-DIGITAL CONVERTER

BACKGROUND OF THE INVENTION

In measuring the dynamic characteristics of an analog to digital converter, i.e. an ADC, a series of outputs of the ADC are acquired while the input signal is continuously changed. Analysis of the output data can be carried out by operating the ADC with a clock of frequency $f_{CLK}$ while providing the ADC with cycles of a wave usually a sine wave, having a frequency $f_{IN}$.

When the measurement of an m-bit ADC is done as described above, the number of all the possible code words is $2^m$, and it is preferable to have all of the code words appear at the output of the ADC during the measuring process. If the input signal is a sine wave and the Analog to Digital-conversion is to be done at uniform intervals, at least $\pi * 2^{m-1}$ number of conversions of different bit combinations are to be done in one cycle of the input signal but, actually more Analog to Digital-conversions are done.

Because of the limitation of the conversion speed, however, it is not possible to perform all the necessary conversions during a single cycle of the input signal. Thus, the required Analog to Digital-conversions are done over a multiplicity of cycles of the input sine wave.

When the necessary Analog to Digital conversions are to be done over n cycles of a sine wave input signal, the ratio, $f_{IN}:f_{CLK}$ should not be the ratio between two simple integers; otherwise a plurality of points on the input sine wave of the same phase would be repeatedly sampled for Analog to Digital-conversion during the n cycles. It would therefore be impossible to use all the possible code words as the digital outputs of the ADC. In FIG. 1, for example, $f_{IN}:f_{CLK}=1:4$, in which case only 3 code words could be evaluated since code words for the phases 0 and $\pi$ are of the same value. At most there would be four, even if the phase of the clock is slightly shifted. In FIG. 2, however, $f_{IN}:f_{CLK}=5:16$, the output code words of the ADC can be evaluated at 16 different phases of the input sine wave over 16 clock cycles. Actually, it is necessary to take more data points, and it is preferable to make a slight phase difference between the input sine wave and the clock, typically a quarter of the period of the clock.

The measurement of dynamic characteristics of an ADC as described above has been done with a configuration such as shown in FIG. 3. In this figure, oscillators 42 and 44 are provided to respectively generate an input sine wave signal and a clock. ADC 24, which is the device under test, Analog to Digital-converts this generated input sine wave at the timing of the clock 44 and stores the results sequentially in a memory 26. After providing the necessary number of date samples to the memory 26, any required evaluation is done by reading them out using a data processing device or the like, not shown. As one example of such an evaluation, consult, *How to Evaluate the Performance of Waveform Digitizers*, Denshi Kagaku, July, 1981, pp. 18–23, or Japanese patent laid-open No. Showa 62-38618, entitled *Apparatus for Measuring Dynamic Characteristics*, assigned to Yokogawa-Hewlett-Packard Ltd. Because the evaluation itself does not directly relate to the substance of the present invention, no further explanation will be given here.

When the measurement is executed with the arrangement shown in FIG. 3, the relationship between the oscillation frequencies of the oscillator for the sine wave input signal to the ADC 24 and the oscillator 44 for the clock signal may arbitrarily be set. However, some jitter exists between these frequencies since the sine wave input signal and the clock signal are generated by mutually independent oscillators. Because it is quite difficult to remove this jitter, it interferes with the measurement of the dynamic characteristics of a high speed ADC. Furthermore, because it is impossible to control the phase relationship between these two signals with this arrangement, the measurement starts at a point of different phase on the sine wave input for each measurement. For example, assume that the first measurement produces the output codes to the memory 26 corresponding to the series of points shown in FIG. 2. The next measurement might start at the point shifted by $\Delta$ from the starting point of the first measurement. Because the measurement conditions vary from measurement to measurement, the measurement method of the prior art lacks repeatability.

BRIEF DESCRIPTION OF THE DRAWINGS

FIG. 1 illustrates what occurs when the ration of the frequency of a sine wave to the clock frequency $f_{CLK}$ is 1:4, FIG. 2 illustrates a situation where $f_{IN}:F_{CLK}=5:16$.

BRIEF SUMMARY OF THE INVENTION

According to the preferred embodiment of the present invention, in order to obtain a desired number of data, an analogue signal is generated having the number of the cycles of the analogue signal in the duration during which the data acquisition is executed is relatively prime with the number of data to be acquired. That is, a DAC (Digital to Analog Converter) and a word generator are provided, wherein the word generator has a series of digital data which correspond to the above-mentioned number of cycles of the analogue signal. The word generator sequentially reads out the sequence of the data to give them to the DAC synchronized with a clock signal given by a clock generator. The output of the DAC in turn is provided to an ADC under test via an LPF (Low Pass Filer). Synchronized with the same clock as the word generator, the ADC under test Analog to Digital converts the given signal, the output of the ADC being sequentially stored into a memory. After the desired number of data are acquired in the memory, the sequence of the data in the memory are evaluated with a data processing system or the like.

DETAILED DESCRIPTION OF THE INVENTION

Figure 4:
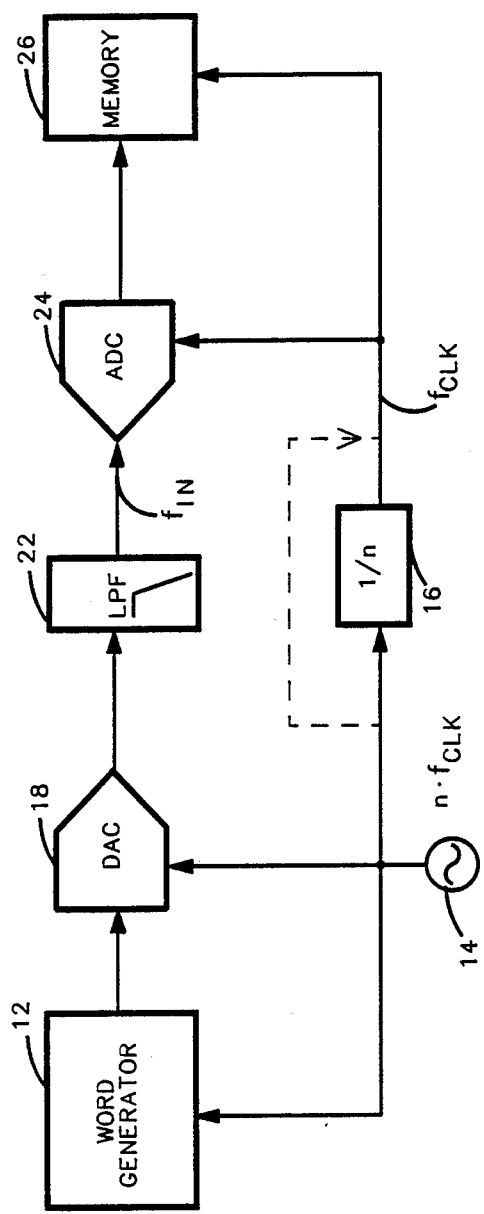
FIG. 4 is a block diagram of one embodiment of the invention.
Figure 3:
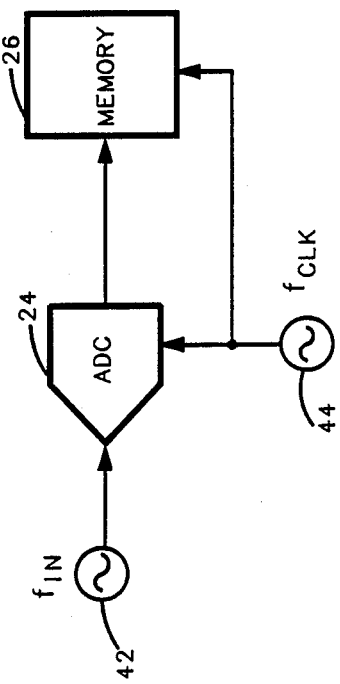
FIG. 3 illustrates presently available apparatus for measuring the dynamic characteristics of an ADC.

FIG. 4 shows one example of the arrangement for implementing the method of the present invention. In the figure, oscillator 14, which generates a clock signal of frequency n * $f_{CLK}$, is connected to word generator 12 and a DAC 18. After the frequency is divided by n, the clock which now has the frequency $f_{CLK}$, is provided to an ADC 24 under test and to a memory 26. A sequence of digital data have previously been stored in word generator 12 which are to be sequentially read out with the clock for generating a sine wave of frequency $f_{IN}$ after passing them through the DAC 18 and the LPF 22. Namely, assuming that n * N words in the memory are to be used, the i-th (i=1,2, ..., n*N) word is required to have the date representing:

$$SIN(2\pi M*i/(n*N)+\theta)$$

wherein $\theta$ is a quantity representing phase shift. This arrangement enables the generation of sine wave of frequency $f_{IN}=M * f_{CLK}/(n*N)$. Thus two signals are generated from a single signal source 14 whose, frequencies are in the following relation: $f_{IN}:f_{CLK}=m:n*N$. This ratio is determined as described above and should be selected to be irreducible such as 683:2048. With a clock whose frequency has been made to be $f_{CLK}$ by frequency division by n through 1/n frequency divider 16, the ADC 2 under test Analog to Digital-converts the sine wave of the frequency $f_{IN}$ generated as described above at the interval of $1/f_{CLK}$. These conversion outputs of the ADC 24 are stored in memory 26 in synchronizing with the clock. Though memory 26 includes a circuit for generating the storing timing which takes the signal delay by the Analog to Digital-conversion in ADC 24 into account and a counter circuit for incrementing the location in the memory to be stored next, they are omitted in the figure since they are not the essential portion of the invention itself. The data stored in memory 26 as explained above will be analyzed, e.g., as described in the references referred to above.

The reason for providing the 1/n frequency divider 16 is now explained. If the resolution With Which the DAC 18 performs DA-conversion on the output word from generator 12 is low, then the conversion error will appear as a small jitter at the analogue output. A DA conversion clock of higher frequency can reduce this jitter. To employ this approach, the frequency of oscillator 14 is set high, and the ADC 24 and the memory 26 are provided with the frequency-divided clock provided by the divider 16. Thus, when the resolution of the DAC 18 is sufficiently high and this small jitter is of little problem, the 1/n frequency divider 16 can be omitted as shown by the dotted line in FIG. 4, in which case the frequency of oscillator 14 is $f_{CLK}$.

Because the input signal which is provided to the ADC 24 under test is generated using the series of the data stored in the memory of the word generator 12, the measurement conditions can easily be changed by modifying this data. This can be done by changing the starting point of the sequential read out of the data, etc. For example, frequency $f_{IN}$, phase 0 and the amplitude of the input signal can freely be changed. The number of the output data points of the ADC 24 to be provided to the memory 26 can also be changed. Furthermore, the input signal to ADC 24 may not be a sine wave, as long as it conforms to the objects of the measurement to be executed.

Because, as explained above, there is no jitter between the input signal of the ADC under test and the clock applied to the ADC, it is possible to attain an accurate measurement. In addition, because it is possible to take an accurate and flexible control on the relation between the input signal to the ADC clock, the repeatability and flexibility of the measurement can be greatly improved over the prior art.

What is claimed:

1. Apparatus for providing information from which the dynamic characteristics of an analog to digital converter may be measured comprising:
   a word generator having stored therein digital words representing the amplitudes at different points of at least one cycle;
   means for providing a clock signal for said generator;
   means for controlling said wave generator so that it outputs digital words in synchronism with said clock signal in such manner so as to provide the words for a plurality of cycles of an analog wave;
   a digital to analog converter coupled to said latter means for providing said plurality of cycles of the analog wave;
   an analog to digital converter to be measured coupled to receive said plurality of cycles of said analog wave; and
   means for deriving clock signals of a predetermined frequency from said means for providing a clock signal and applying them to said analog to digital converter being measured, the ratio of the number of said clock signals occurring during said plurality of cycles to the number of said cycles being irreducible.

2. Apparatus for use in measuring dynamic characteristics of an analog to digital converter comprising:
   a clock source for providing a clock signal,
   a word generating means connected to said clock source for outputting digital data sequentially in synchronization with said clock signal, said word generating means having stored therein a sequence of data for a plurality of cycles of an analog wave,
   a digital to analog converter connected to said word generating means and to said clock for outputting an analog wave having a plurality of cycles in synchronization with said clock signal,
   an analog to digital converter being measured being coupled to said digital to analog converter and to said clock source, the ratio of the number of digital words produced during said plurality of cycles to the number of said plurality of cycles being irreducible.

3. Apparatus for producing information from which the dynamic characteristics of an analog to digital converter may be measured comprising:
   a source of clock signals,
   a word generator coupled to said source for generating digital words representing a plurality of sine waves,
   a digital to analog converter coupled to said source of clock signal and to said word generator so as to produce said plurality of sine waves in analog form,
   an analog to digital converter being measured,
   means for coupling said analog to digital converter being measured to said digital to analog converter, and
   means for coupling said source of clock signals to said analog to digital converter being measured, the ratio of the number of clock signals applied thereto to the number of said plurality of sine waves generated by said word generator being irreducible.

4. Apparatus as set forth in claim 3 further comprising:
   a memory coupled to said analog to digital converter being measured, and
   means for coupling the clock signals applied to said analog to digital converter being measured to said memory.

* * * * *